(12) United States Patent
Kawashima et al.

(10) Patent No.: US 9,508,682 B2
(45) Date of Patent: Nov. 29, 2016

(54) ORGANIC EL LUMINESCENT DEVICE

(71) Applicant: NEC Lighting, Ltd., Tokyo (JP)

(72) Inventors: Yasuki Kawashima, Tokyo (JP); Kazuya Ito, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 14/655,315

(22) PCT Filed: Dec. 10, 2013

(86) PCT No.: PCT/JP2013/083081
§ 371 (c)(1),
(2) Date: Jun. 24, 2015

(87) PCT Pub. No.: WO2014/109159
PCT Pub. Date: Jul. 17, 2014

(65) Prior Publication Data
US 2015/0357305 A1     Dec. 10, 2015

(30) Foreign Application Priority Data
Jan. 11, 2013   (JP) ................... 2013-003196

(51) Int. Cl.
*H01L 25/04*    (2014.01)
*H01L 51/52*    (2006.01)
*H01L 27/32*    (2006.01)

(52) U.S. Cl.
CPC ......... *H01L 25/048* (2013.01); *H01L 27/3206* (2013.01); *H01L 51/5215* (2013.01); *H01L 51/5234* (2013.01); *H01L 51/5271* (2013.01); *H01L 27/3237* (2013.01); *H01L 2251/5323* (2013.01); *H01L 2251/5361* (2013.01); *H01L 2924/0002* (2013.01)

(58) Field of Classification Search
CPC ............... H01L 25/048; H01L 51/524; H01L 51/5271; H01L 27/3206
See application file for complete search history.

(56) References Cited

U.S. PATENT DOCUMENTS 7,745,986 B2 * 6/2010 Ito .................... G02F 1/133555
                                                313/504
2007/0120465 A1    5/2007 Ito et al.
(Continued)

FOREIGN PATENT DOCUMENTS

EP    1940202 A1    7/2008
EP    2473002 A2    7/2012
(Continued)

OTHER PUBLICATIONS

International Search Report corresponding to PCT/JP2013/083081 mailed on Jan. 14, 2014 (2 pages).

*Primary Examiner* — Mark Prenty
(74) *Attorney, Agent, or Firm* — Wilmer Cutler Pickering Hale and Dorr LLP

(57) ABSTRACT

An organic EL luminescent device (1) includes: organic EL panels of no smaller than 2 (10, 11) including a light-transmitting organic EL panel (10, 11), the light-transmitting organic EL panel having a first electrode (32), formed on a transparent substrate (31), having optical transparency, an organic layer (33), formed on the first electrode (32), having a light emitting layer and a second electrode (35), formed on the organic layer (33), having optical transparency; and a support (21) to support the no-smaller-than-2 organic EL panels in a manner overlapping each other.

12 Claims, 12 Drawing Sheets

(56) References Cited

U.S. PATENT DOCUMENTS

2009/0230415 A1  9/2009  Ide et al.
2010/0164344 A1  7/2010  Boerner et al.

FOREIGN PATENT DOCUMENTS

| | | |
|---|---|---|
| JP | 2000-105557 A | 4/2000 |
| JP | 2001-076882 A | 3/2001 |
| JP | 2002-260859 A | 9/2002 |
| JP | 2004-127639 A | 4/2004 |
| JP | 2005-203196 A | 7/2005 |
| JP | 2005-317296 A | 11/2005 |
| JP | 2006-155940 A | 6/2006 |
| JP | 2006-351211 A | 12/2006 |
| JP | 2007-115645 A | 5/2007 |
| JP | 2007-525706 A | 9/2007 |
| JP | 2009-076390 A | 4/2009 |
| JP | 2009-526360 A | 7/2009 |
| JP | 2009-266503 A | 11/2009 |
| JP | 2012-142203 A | 7/2012 |
| WO | WO-2005/086257 A1 | 9/2005 |
| WO | WO-2007/091215 A1 | 8/2007 |

* cited by examiner

ORGANIC EL LUMINESCENT DEVICE

CROSS-REFERENCE TO RELATED APPLICATIONS

This application is a national stage application of International Application No. PCT/JP2013/083081 entitled "Organic El Luminescent Device" filed on Dec. 10, 2013, which claims priority to Japanese Application No. 2013-003196 filed on Jan. 11, 2013, the disclosures of which are hereby incorporated by reference in their entirety.

TECHNICAL FIELD

The present invention relates to an organic EL luminescent device.

BACKGROUND ART

Making use of an organic electroluminescence element (hereinafter, referred to as an organic EL element) as a light emitting device in various display apparatus is drawing attention thanks to its advantages such as having a high visibility due to light emission by the device itself and an excellent impact resistance due to being a solid-state device. There is also a feature that the organic EL element can be made thin because it is a surface light source. The structure of an organic EL element is based on lamination of an anode, a light emitting layer and a cathode, and a structure in which a transparent anode is formed on a substrate which uses a glass plate or the like is usually adopted. In this case, emitted light is taken out toward the substrate side.

An organic EL element which takes out emitted light from the cathode side is also known. For example, an organic EL element of patent document 2 includes an anode, an organic layer, a barrier property conductive layer having optical transparency and a cathode having optical transparency, which is provided on a substrate in order.

There has been also devised an organic EL element in which the two electrodes are formed of transparent electrodes, and light emission is made toward the both sides. For example, in an organic EL element of patent document 1, a first electrode of optical transparency is provided on a substrate, and an organic layer having at least a light emitting layer is provided on the first electrode. Further, a second electrode of optical transparency is provided on the organic layer, and at least the second electrode is formed of indium oxide.

An organic EL element is expected to be used for a display apparatus because it is of a self-luminosity and is a surface light source. When it is used for a display apparatus, there are several methods for full colorization such as: a method in which organic EL light emitting elements that emit light of three colors of red (R) green (G) and blue (B) are arranged on a substrate for every one pixel (so-called a three-color coloring method); a color conversion method by applying wavelength distribution conversion to emitted light from the backlight (hereinafter, referred to as CCM method); and a color filtering method to radiate emitted light from backlight through a color filter (patent document 3). In patent document 3, there is described a passive-matrix-drive top emission type EL element using CCM method.

Also, in patent document 4, there is described a surface-emitting light source which improves luminance by improving light extraction efficiency. In a surface-emitting light source according to patent document 4, there is formed on a surface of a transparent substrate a light emitting element constituted of a laminated body of: a transparent electrode; a light emitting layer including an organic EL layer; and a reflection electrode. The light emitting element has a prismatic structure face of a multiple-plane structure on a surface of a transparent substrate. As a result, a bend section is made to be provided in a light emitting layer, and total reflection light within the light emitting layer is taken out from the bend section. By making a light emitting element be of a multiple plane structure, practical improvement of luminance by increase of a luminous area is achieved.

CITATION LIST

Patent Literature

[PTL 1] Japanese Patent Application Laid-Open No. 2001-076882

[PTL 2] Japanese Patent Application Laid-Open No. 2004-127639

[PTL 3] Japanese Patent Application Laid-Open No. 2005-203196

[PTL 4] Japanese Patent Application Laid-Open No. 2006-351211

SUMMARY OF INVENTION

Technical Problem

All of these organic EL light emitting elements of the related technologies have a light emitting surface of a single plane when seen as a luminescent device as a whole. An organic EL light emitting element can be formed into a curved surface, however, there is no depth as a light emitting surface in a direction perpendicular to the light emitting surface. Also, in a luminescent device using an organic EL element of the related technologies, there is no sense of depth in a direction perpendicular to the light emitting surface.

The present invention has been made in view of the above-mentioned circumstances, and its object is to provide an organic EL luminescent device having a sense of depth in a light emitting surface.

Solution to Problem

An organic EL luminescent device according to a viewpoint of the present invention, comprises:

organic EL panels of no smaller than 2 including a light-transmitting organic EL panel, said light-transmitting organic EL panel having a first electrode, formed on a transparent substrate, having optical transparency, an organic layer, formed on said first electrode, having a light emitting layer, and a second electrode, formed on said organic layer, having optical transparency; and a support to support said no-smaller-than-2 organic EL panels in a manner overlapping each other.

Advantageous Effects of Invention

According to the present invention, an organic EL luminescent device having a sense of depth in a light emitting surface can be provided.

DESCRIPTION OF EMBODIMENTS

Figure 1:
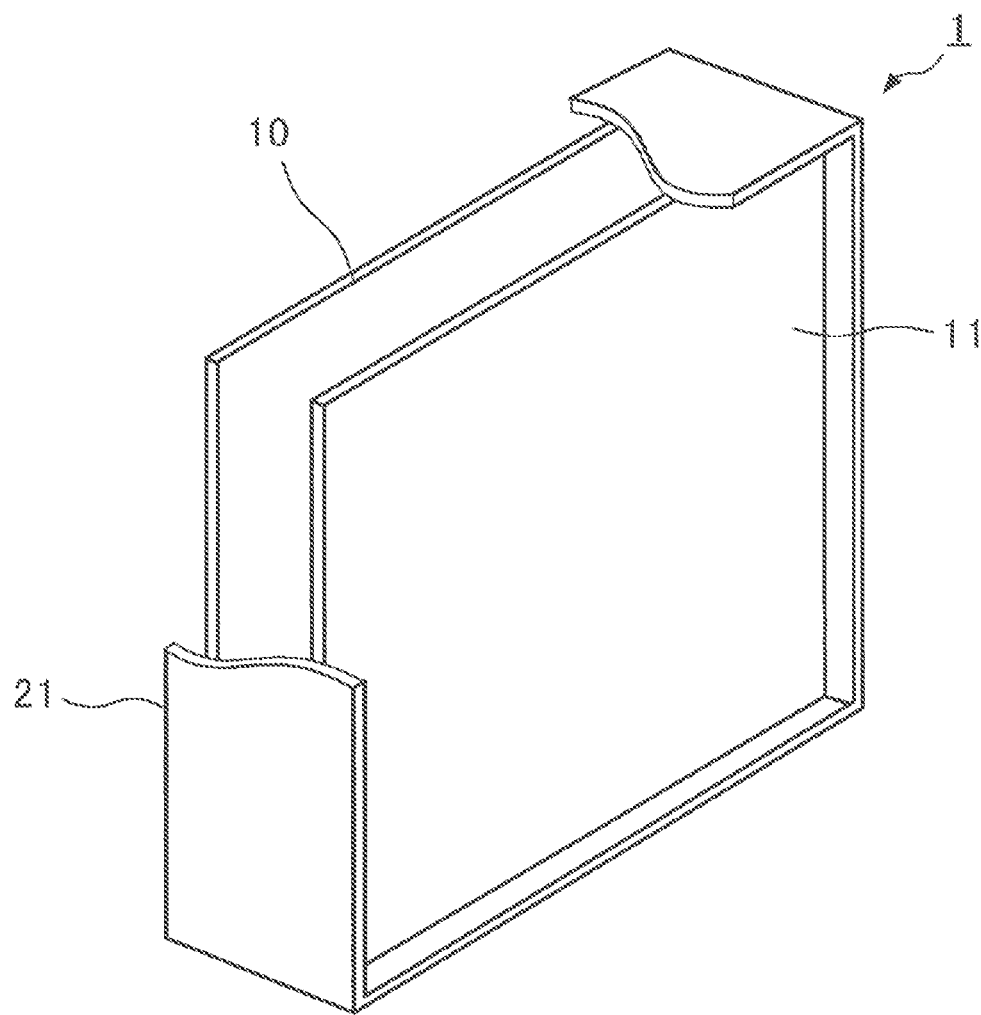
FIG. 1 is a partially broken away perspective view of an organic EL luminescent device according to exemplary embodiment 1 of the present invention.

Hereinafter, exemplary embodiments of the present invention will be described with reference to drawings. In the drawings, a same code is attached to parts which are identical or correspond to each other.

(Exemplary Embodiment 1)

FIG. 1 is a broken away perspective view of an organic EL luminescent device according to the exemplary embodiment 1 of the present invention. An organic EL luminescent device 1 includes two organic EL panels 10 and 11, and a support 21 which supports the organic EL panels 10 and 11. A lighting circuit and wiring for lighting the organic EL panels 10 and 11 are omitted in this figure. The support 21 supports the two organic EL panels 10 and 11 approximately in parallel in a direction perpendicular to their main surfaces in an overlapped manner. Each of both the organic EL panels 10 and 11 has a substrate and an electrode that are transparent, and make light penetrate through them.

Figure 2:
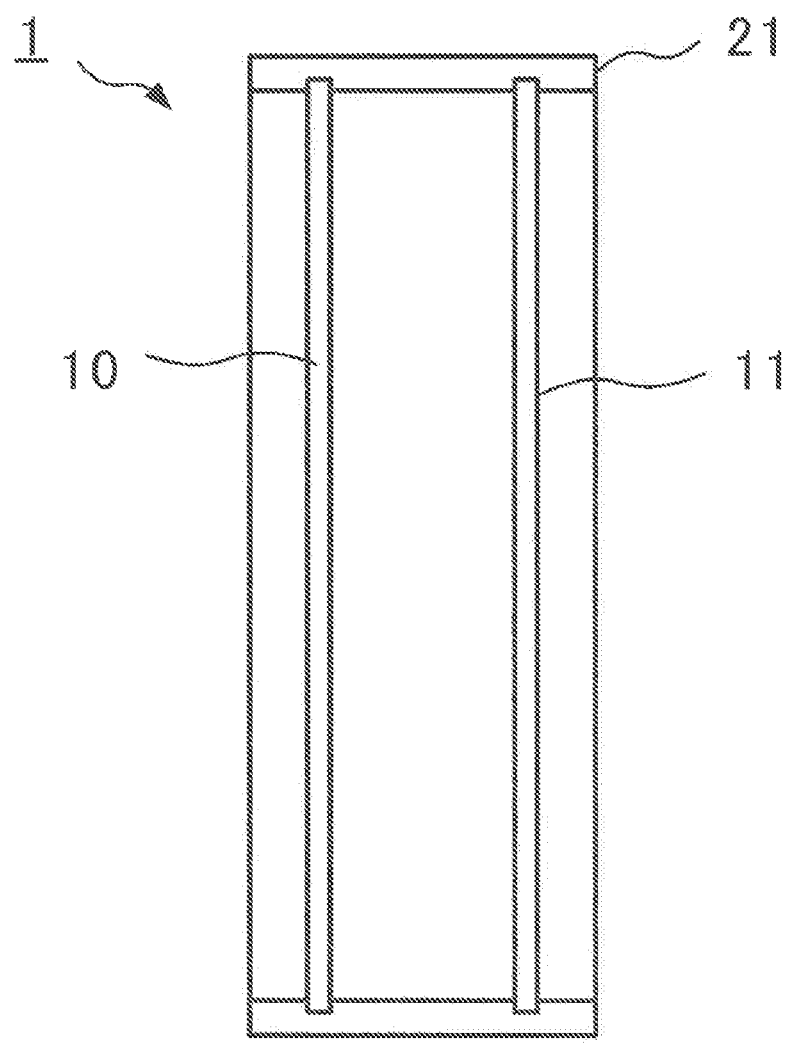
FIG. 2 is a sectional view of an organic EL luminescent device according to the exemplary embodiment 1.

FIG. 2 is a sectional view of an organic EL luminescent device according to the exemplary embodiment 1. The two organic EL panels 10 and 11 are arranged in parallel having a gap between them. In the organic EL panels 10 and 11, an electrode and a light emitting layer are formed almost all over their surfaces, and light is emitted with a monochromatic color over a whole surface. There is a case where the organic EL panel 10 and the organic EL panel 11 have a same luminescent color, and a case where they have different luminescent colors.

Figure 3:
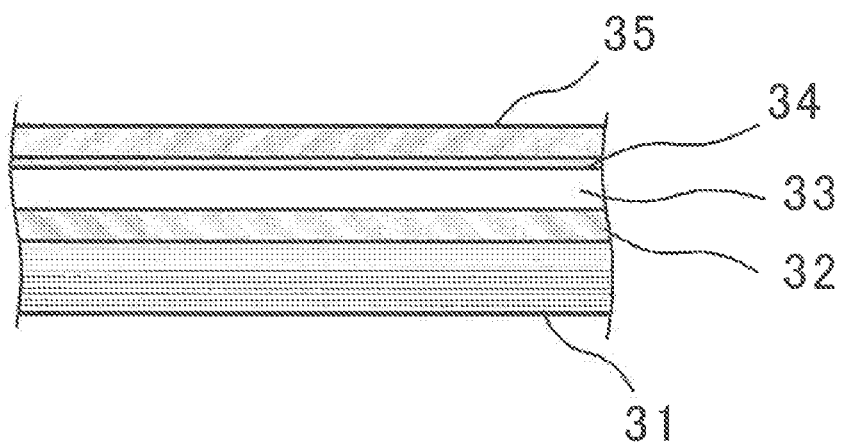
FIG. 3 is a sectional view of an organic EL panel according to the exemplary embodiment 1.

FIG. 3 is a sectional view of an organic EL panel according to the exemplary embodiment 1. In the organic EL panels 10 and 11, there are formed on a transparent substrate 31 of such as glass: an anode 32; an organic layer 33; a barrier-property conductive layer 34 having optical transparency; and a cathode 35 having optical transparency. The anode 32 is formed of such as ITO (Indium Tin Oxide) or TiN, for example, and makes light penetrate through it. There is a case where the organic layer 33 includes a hole transport layer, an organic EL light emitting layer, an electron transport layer and an electron injection layer, for example. An organic EL light emitting layer is included in the organic layer 33 at least. According to a substance of the organic EL light emitting layer, the luminescent color of the organic EL panel differs.

The barrier-property conductive layer 34 is formed of a Ca diffusion layer, a conductor layer such as Ag, Mg and TiN, or a thin film of such as metal, an inorganic nitride and an inorganic oxide, for example. The barrier-property conductive layer 34 prevents a cathode material from diffusing to the organic layer 33, and makes electron injection to the organic layer 33 easy to be performed.

The cathode 35 is formed of an indium oxide ($In_2O_3$) or the like, for example, and makes light penetrate through it. In such cases, it is desirable to place an In metal layer as the barrier-property conductive layer 34 in order to take matching between conduction levels of the indium oxide and the electron injection layer or the electron transport layer. When diffusion of the cathode material to the organic layer 33 can be ignored, and it is not needed to take matching between the conduction levels for injecting electron from the cathode 35 to the organic layer 33, the barrier-property conductive layer 34 may not exist.

Because both the organic EL panels 10 and 11 make light penetrates through, emitted light from the organic EL panel 10 is applied outside the organic EL luminescent device 1 (the left side of FIG. 2) directly and also penetrates through the organic EL panel 11, and is applied to the opposite side of the organic EL luminescent device 1 (the right side of FIG. 2). Emitted light from the organic EL panel 11 is applied outside the organic EL luminescent device 1 (right side of FIG. 2) directly and, at the same time, penetrates through the organic EL panel 10 and is applied to the opposite side of the organic EL luminescent device 1 (the left side of FIG. 2). When the organic EL panels 10 and 11 are lit simultaneously, emitted light from the organic EL panel 10 and emitted light from the organic EL panel 11 mix as a luminescent color. However, when seen from the side of the organic EL panel 10 (11), it is possible to feel emitted light of the organic EL panel 11 (10) through the organic EL panel 10 (11). That is, a sense of depth occurs to emitted light. The reason of this is that, because there is a gap between the organic EL panel 10 and the organic EL panel 11, a parallax is caused. A sense of depth can be confirmed by lighting up the organic EL panel 11 after having lit the organic EL panel 10. When the distance between the organic EL panels 10 and 11 is large, or when the luminescent colors are different, a sense of depth is easier to be recognized.

In a case when the luminescent colors of the organic EL panels 10 and 11 are the same and both of the two are lit, a luminescent color does not change, however, luminance becomes strong. When there is a difference in the luminescent colors, a luminescent color changes between a case when both of them are lit and a case in which they are lit up independently, respectively. Also, it is possible to change a color tone by changing emission intensities of the both. When the organic EL panels 10 and 11 are formed in a monochromatic luminescent color, because a portion which does not emit light due to separation of the organic layer 33 and wiring in a panel can be made very small, an effective luminous area is large, and, thus, it is possible to make an emission intensity per unit area of the organic EL luminescent device 1 large.

When arranging such that there are three organic EL panels of the organic EL luminescent device 1, and the panels are made to be of monochromatic luminescent colors of red (R), green (G) and blue (B), respectively, the overall color tone can be changed freely. Moreover, because an effective luminous area can be made large, the organic EL luminescent device 1 of a strong emission intensity is obtained.

(Exemplary Embodiment 2)

Figure 4:
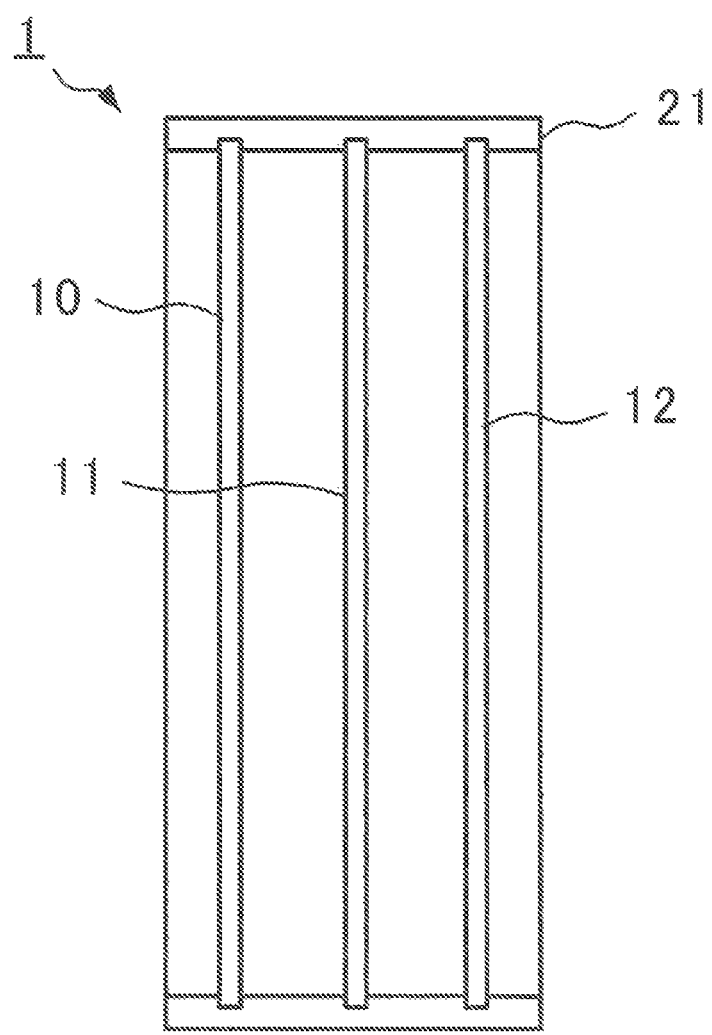
FIG. 4 is a sectional view of an organic EL luminescent device according to exemplary embodiment 2 of the present invention.

FIG. 4 is a sectional view of an organic EL luminescent device according to the exemplary embodiment 2 of the present invention. An organic EL luminescent device 1 of the exemplary embodiment 2 includes three organic EL panels 10, 11 and 12. One panel located in an end among the three organic EL panels 10 and 11 and 12 reflects light. It is a structure in which the organic EL panel 12 that reflects light is added to the organic EL luminescent device 1 of the exemplary embodiment 1.

The organic EL panel 12 that reflects light is composed such that an anode 32 or a cathode 35 reflects light, for example. Alternatively, a member which reflects light may be formed on a substrate 31 of the organic EL panel 12 of optical transparency in the side opposite to the electrodes. The organic EL panel 12 that reflects light emits light toward the side of the other organic EL panels 10 and 11. Light heading to the organic EL panel 12 from the other organic EL panels 10 and 11 is reflected by the reflecting member of the organic EL panel 12 and emitted from the side of the transparent organic EL panel 10.

Figure 5:
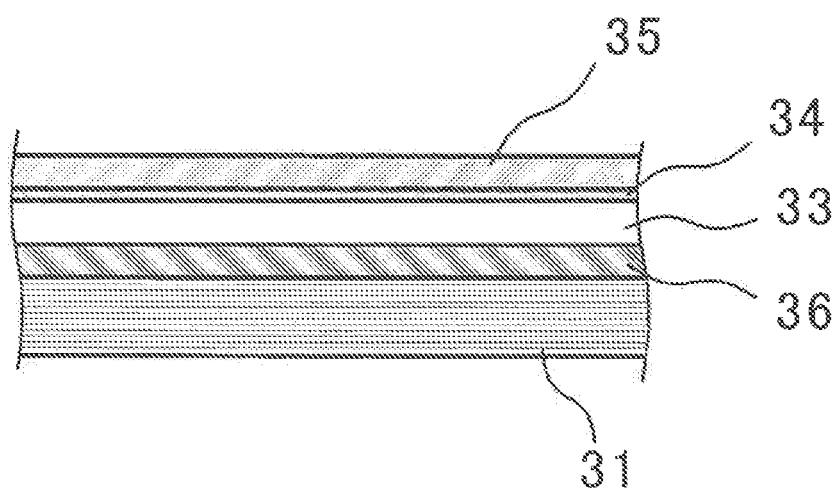
FIG. 5 is a sectional view of an organic EL panel including a reflecting member.

FIG. 5 is a sectional view of an organic EL panel including a reflecting member. In the example of FIG. 5, a reflection electrode 36 is formed on the substrate 31 as a reflecting member. In this case, emitted light is taken out toward the electrode side opposite to the side of the substrate 31. Accordingly, the substrate 31 is arranged in the side opposite to the other organic EL panels.

The reflection electrode 36 can be formed using metal, an amorphous alloy or a crystallite alloy of a high reflectance. Metal of a high reflectance includes Al, Ag, Mo, W, Ni and Cr, for example. An amorphous alloy of a high reflectance includes NiP, NiB, CrP and CrB, for example. A crystallite alloy of a high reflectance includes NiAl, for example. The reflection electrode 36 may be employed as an anode, or it may be employed as a cathode. When the reflection electrode 36 is employed as an anode, it is possible to improve an electron hole injection coefficient to the organic EL layer by laminating conductive metallic oxide such as $SnO_2$, $In_2O_3$, ITO, IZO and ZnO:Al on the high reflectivity material. When the reflection electrode 36 is employed as a cathode, efficiency of electron injection to an organic EL layer can be improved by making a structuring layer of the organic layer 33 that contacts the reflection electrode 36 be an electron injection layer.

In FIG. 5, a case when the reflection electrode 36 is made to be an anode is supposed. When the reflection electrode 36 is made to be an anode, the composition of the organic layer 33, the barrier-property conductive layer 34 and the cathode 35 is similar to that of the exemplary embodiment 1. When the reflection electrode 36 is made to be a cathode, an anode is formed over the organic layer 33.

It may also be of a structure in which the cathode of FIG. 3 is made to be the reflection electrode 36, and emitted light is taken out into the substrate 31 side. In this case, the organic EL panel 12 is arranged in a manner that the substrate 31 side faces the other organic EL panels.

In the exemplary embodiment 2, light is applied to one side of the organic EL luminescent device 1, the one side being a side in which the organic EL panel 10 that makes light penetrate through is arranged (the side opposite to the side where the organic EL panel which reflects light is arranged). Because light of the other organic EL panels 10 and 11 is reflected by the reflecting member, and applied toward one side, intensity in the light emitting side becomes strong. In addition, because the virtual images of the organic EL panels 10 and 11 will be formed by the reflecting member when seen from the light emitting side, a sense of depth is increased.

In the organic EL panel 12 that reflects light, the reflection electrode 36 does not have to be formed all over the face of the panel surface. A portion which does not reflect light becomes of a different color tone or luminance, and, thus, decorative or a designing effect can be created according to its shape. In addition, an effect of emphasizing a sense of depth can be expected. A portion which does not reflect light may be composed so that light may penetrate through it. In this case, a pattern that reflects light may be formed in organic EL panels of no smaller than 2. For example, by forming a portion which makes light penetrate through in the organic EL panel 12, a pattern to emit light toward the organic EL panel 12 side of the organic EL luminescent device 1 can be formed. As a result, a decorative or designing effect of the organic EL luminescent device 1 can be generated.

Effects in a case when a luminescent color of each of the organic EL panels 10, 11 and 12 is monochromatic and their luminescent colors are the same, or when the luminescent colors are different are similar to those described in exemplary embodiment 1. Similarly, it is also possible to make them be of monochromatic luminescent colors of red (R), green (G) and blue (B), respectively, and change a total color tone freely.

Figure 6:
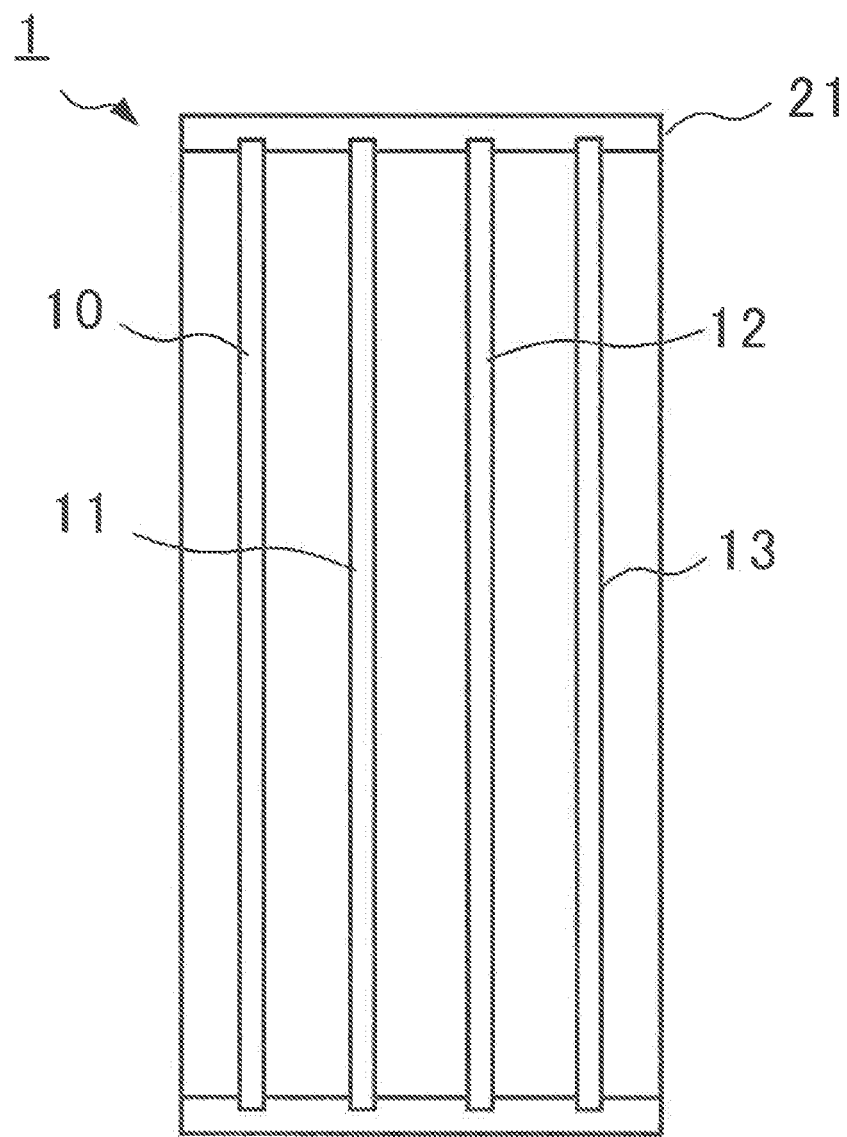
FIG. 6 is a sectional view of an organic EL luminescent device according to modification 1 of the exemplary embodiment 2.

FIG. 6 is a sectional view of an organic EL luminescent device according to the modification 1 of the exemplary embodiment 2. The modification 1 is a case where the organic EL panel 12 that reflects light is arranged between the organic EL panels which make light penetrate through them. For example, the second panel from the right in FIG. 6 is made to be the organic EL panel 12 that reflects light, and the others are made to be organic EL panels which make light penetrate through them. In this case, there are two types of a direction of the light emitting surface of the organic EL panel 12 that reflects light.

When the organic EL panel 12 emits light toward the side with the larger number of organic EL panels which make light penetrate through in FIG. 6 (the left), the structure of the three panels in the left is similar to that of FIG. 4. When composing the organic EL panel 12 that reflects light such that its rear also reflects light, emitted light from an organic EL panel 13 in the right end is reflected by the rear of the organic EL panel 12, and, thus, the emission intensity increases and a sense of depth is formed.

When the organic EL panel 12 emits light toward the side with the small number of organic EL panels which make light penetrate through in FIG. 6 (the right), the number of light emitting panels becomes the same in both sides of the reflecting member. When composing such that even the rear of the organic EL panel 12 reflects light, the both sides have resemblance structures. However, because there is a difference in a distance between a light emitting surface and a reflecting member, there is a slight difference in vision.

Figure 7:
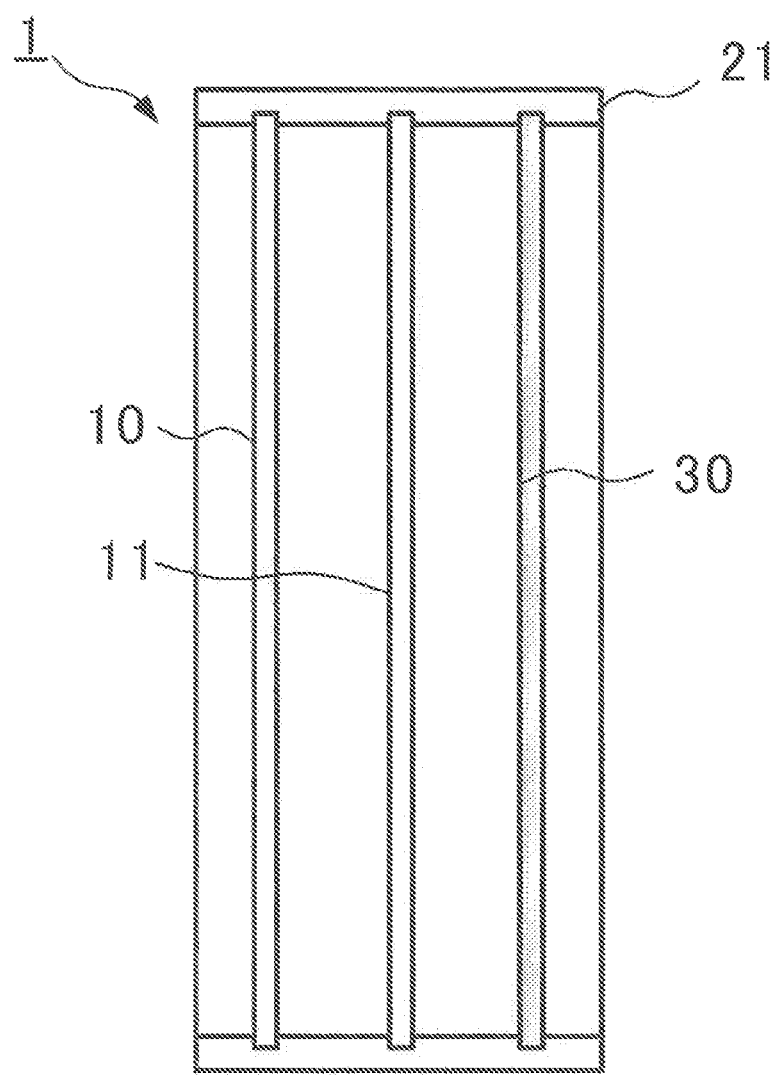
FIG. 7 is a sectional view of an organic EL luminescent device according to modification 2.

FIG. 7 is a sectional view of an organic EL luminescent device according to the modification 2. In the modification 2, in place of the organic EL panel 12 that reflects light, a reflection plate 30 is arranged. Because emitted light from the organic EL panels 10 and 11 is reflected by the reflection plate 30, it is similar to a case where, in the structure of FIG. 4, the number of organic EL panels which make light penetrate through is set to one. It also corresponds to a state that, in the structure of FIG. 4, the organic EL panel 12 that reflects light is made not to emit light.

The reflection plate 30 can be made to be a curved surface such as of a convexity or a concave, not a plane. For example, when the reflection plate is formed as a concave facing toward the organic EL panel 10 and 11 sides, an effect like a downlight can be obtained because reflected light is concentrated.

Figure 8:
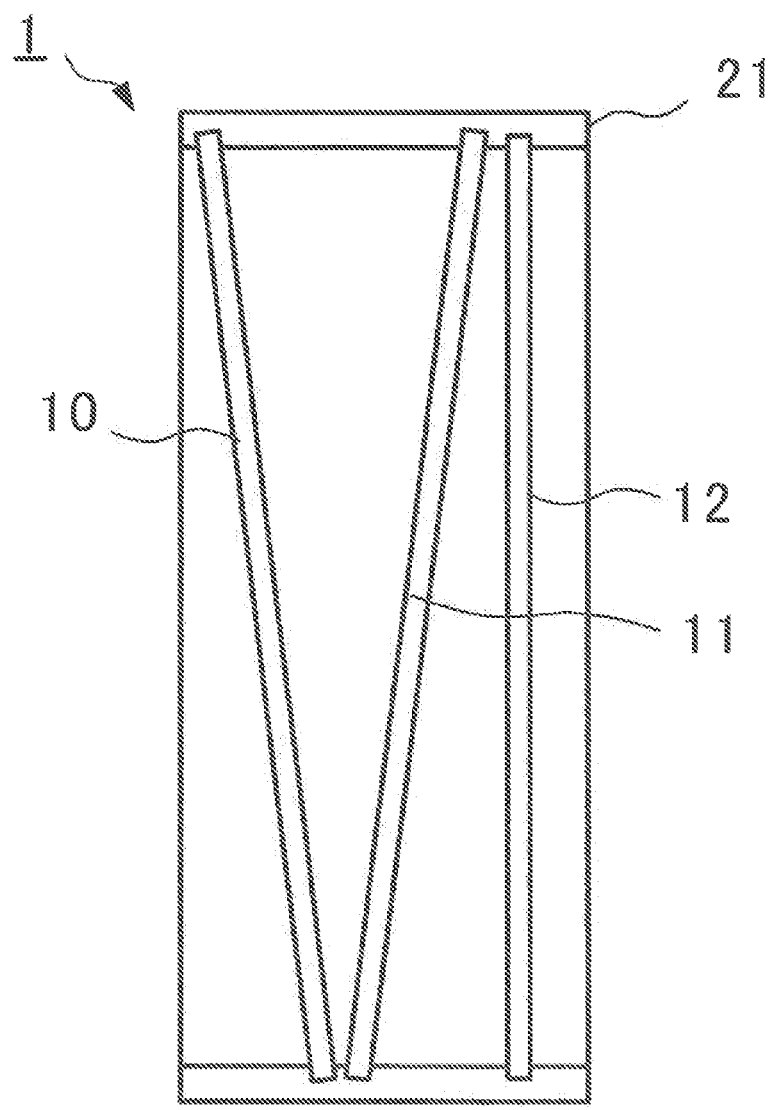
FIG. 8 is a sectional view of an organic EL luminescent device according to modification 3.

FIG. 8 is a sectional view of an organic EL luminescent device according to the modification 3. In the modification 3, the organic EL panels 10 and 11 that make light penetrate through are arranged, not in parallel, but in a manner being inclined mutually. Because light emitting surfaces are not parallel, there is a difference in a sense of depth depending on places, and thus there is an unusual presentation effect. According to selection and arrangement of inclined organic EL panels, different light emission can be produced. The organic EL panel 12 that reflects light may be inclined.

Figure 9:
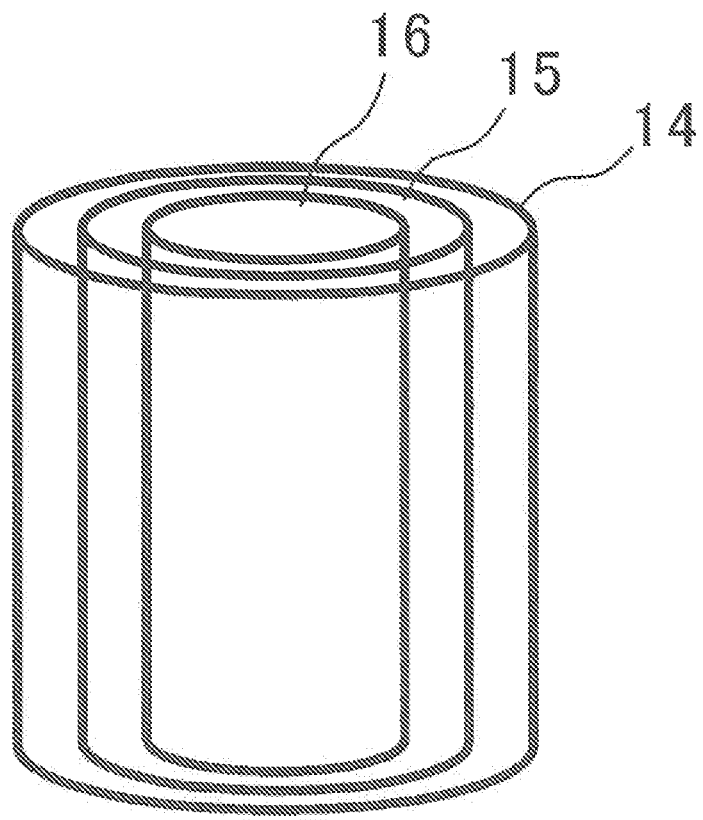
FIG. 9 is a conceptual perspective view of an organic EL luminescent device according to modification 4.

FIG. 9 is a conceptual perspective view of an organic EL luminescent device according to the modification 4. FIG. 9 represents a shape and arrangement of organic EL panels 14, 15 and 16, and the support 21 is omitted. Although, in the exemplary embodiments 1 and 2, a planar organic EL panel has been assumed, an organic EL panel may be formed with a curved surface. FIG. 9 indicates an example in which three organic EL panels are of cylindrical shapes, respectively, and are arranged in a form that their center axes overlap with each other. Also in FIG. 9, the organic EL panels are supported in an overlapped manner in a direction crossing (perpendicular to) the light emitting surface (main surface).

In the form of FIG. 9, a structure in which an organic EL panel which reflects light is arranged in the center and organic EL panels which make light penetrate through are arranged around it can be made. Further, all organic EL panels can be composed so that light may be made to penetrate through. According to whether the organic EL panel in the center reflects light or makes light penetrate through, the way how emitted light looks differs. There is a sense of depth in a light emitting surface in the both cases. In particular, when the luminescent color of each organic EL panel is different from each other, the luminescent colors from the center portion and from the both side portions look different.

Meanwhile, in the above-mentioned modifications 1 to 4, the organic EL panel 12, 16 or the reflection plate 30 which reflects light does not have to reflect light over the whole surface of their panel surfaces. Further, a portion which does not reflect light may be composed so that light may be made to penetrate through. In this case, a pattern that reflects light may be formed into organic EL panels of no smaller than two.

(Exemplary Embodiment 3)

Figure 10:
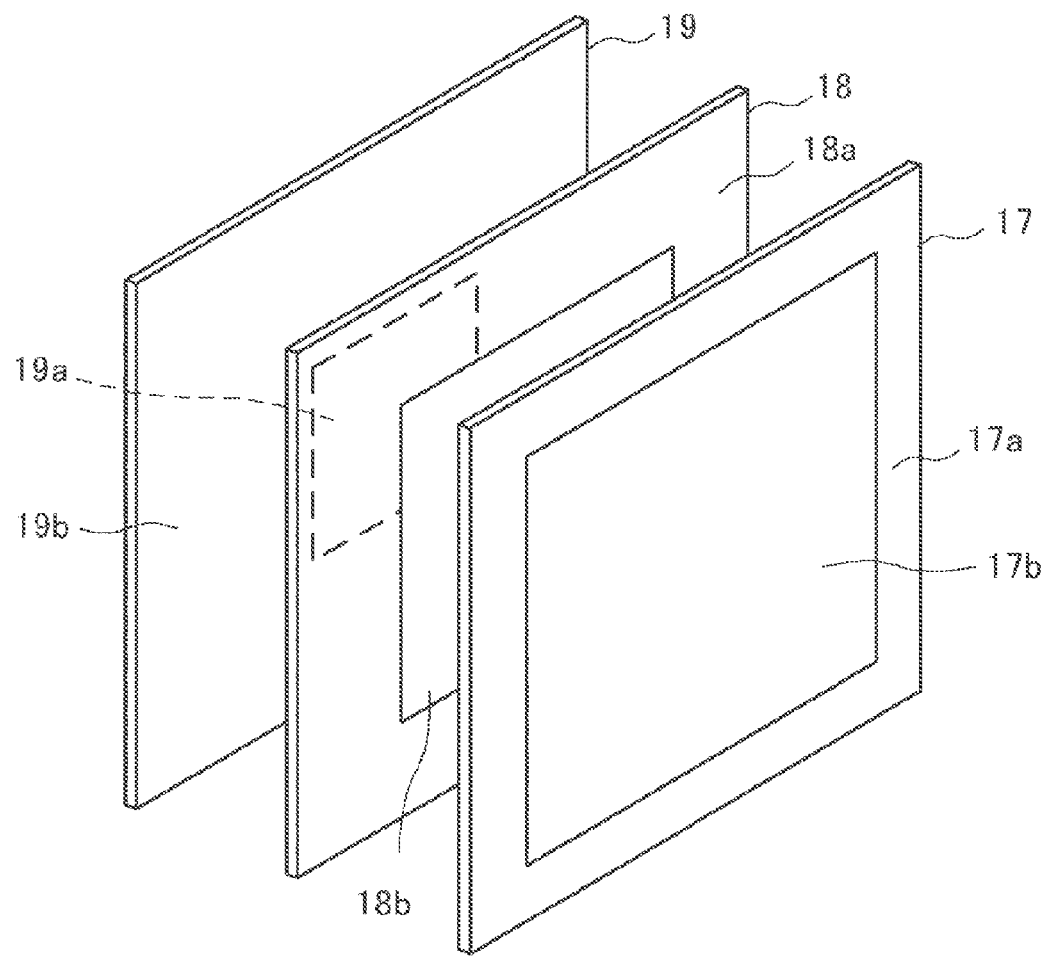
FIG. 10 is a perspective view of an organic EL panel of an organic EL luminescent device according to exemplary embodiment 3 of the present invention.

FIG. 10 is a perspective view of organic EL panels of an organic EL luminescent device according to the exemplary embodiment 3 of the present invention. In FIG. 10, a support is omitted. In organic EL panels 17, 18 and 19, no-light-emission transmission patterns 17b and 18b which are a part of a panel surface that makes light penetrate through without emitting light, and a no-light-emission pattern 19b are formed, respectively. The portions besides the no-light-emission transmission patterns 17b and 18b and the no-light-emission pattern 19b are light-emission patterns 17a, 18a and 19a each having an anode 32, an organic layer 33 and a cathode 35 formed on them to emit light. FIG. 10 indicates an example of a no-light-emission transmission pattern (light-emission pattern).

In FIG. 10, regarding the organic EL panel 17 in the right, the square part in the center is the no-light-emission transmission pattern 17b and its surroundings are the light-emission pattern 17a. About the organic EL panel 18 in the center, the part inside the square in the panel is the no-light-emission transmission pattern 18b, and its surroundings are the light-emission pattern 18a. In the organic EL panel 19 in the left, the part inside the square (dashed line) in the panel is the light-emission pattern 19a, and its surroundings are the no-light-emission pattern 19b. There is a case where the organic EL panel 19 in the left reflects light, or a case where it makes light penetrate through. In the case where light is made to penetrate through, the no-light-emission pattern 19b is a no-light-emission transmission pattern, and in the case where light is reflected, it is a no-light-emission reflection pattern.

Figure 11:
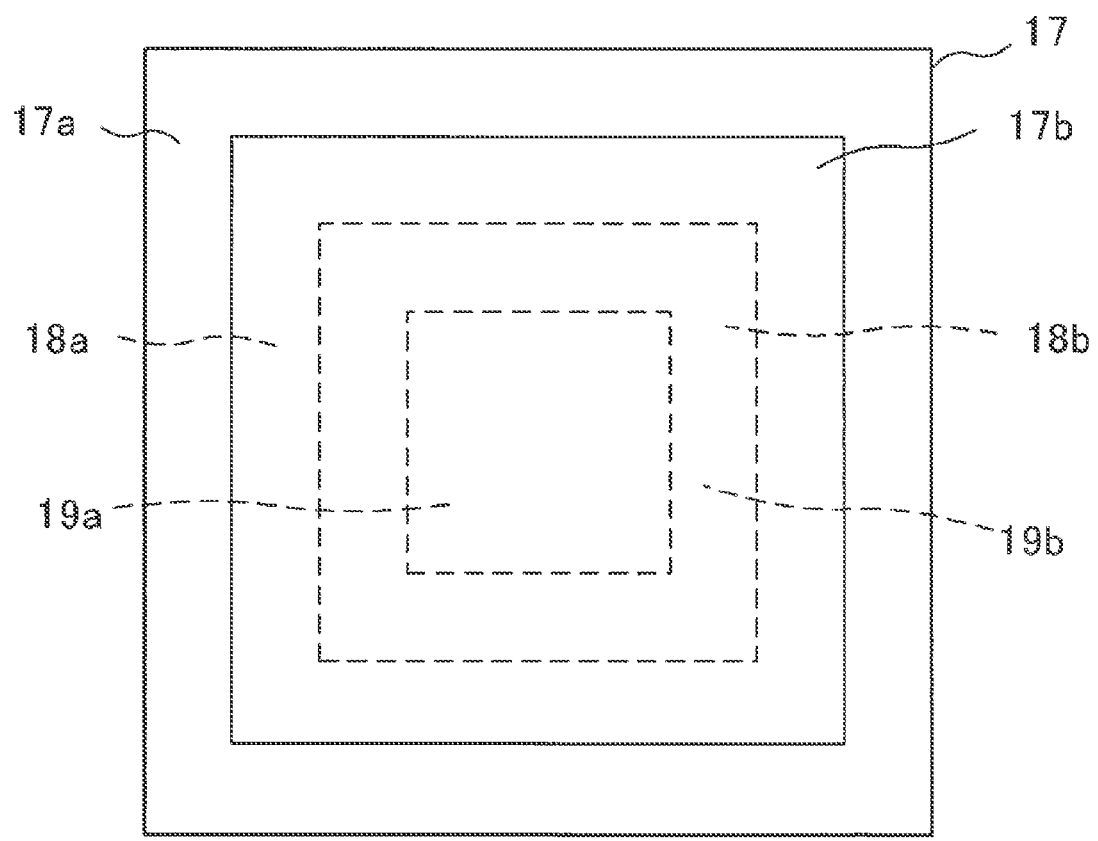
FIG. 11 is a diagram showing an example of a no-light-emission transmission pattern of an organic EL panel according to the exemplary embodiment 3.

FIG. 11 is a diagram showing an example of a no-light-emission transmission pattern of an organic EL panel according to the exemplary embodiment 3. FIG. 11 is a plan view when the organic EL panel of FIG. 10 is seen from the side of the organic EL panel in the right. The boundary of the light-emission pattern and the no-light-emission transmission pattern of the organic EL panel 17 is indicated by a solid line. The boundaries of the light-emission patterns and the no-light-emission transmission patterns of the organic EL panels 18 and 19 are indicated by a dashed line.

The no-light-emission transmission pattern 18b of the organic EL panel 18 and the light-emission pattern 19a of the organic EL panel 19 are seen within the no-light-emission transmission pattern 17b of the organic EL panel 17. The light emitting surfaces are seen accompanied by steps in a direction perpendicular to the main surfaces (in the depth direction). Because the light emitting surfaces are seen accompanied by steps in the depth direction, there is a three-dimensional presentation effect. In particular, when the organic EL panels 17, 18 and 19 are lit in turn, the light emitting surface is seen as if it moves in the depth direction, and, therefore, it attracts attention and a display effect of a high visibility can be expected. When the organic EL panel 19 reflects light, the light-emission patterns of the organic EL panel 17 and 18 are reflected by the organic EL panel 19, and thus the depth looks deeper.

It is optional whether a no-light-emission transmission pattern (light-emission pattern) is formed into an organic EL panel or not. An organic EL panel in which a no-light-emission transmission pattern is formed and a panel not formed may be intermingled. A no-light-emission transmission pattern and the luminescent color of an organic EL panel can be selected optionally.

Also in the exemplary embodiment 3, the luminescent color of each organic EL panel is optional. Each organic EL panel may be made to be a monochromatic luminescent color, or a part of an organic EL panel may have a different luminescent color from the other part. The luminescent colors of respective organic EL panels can be made to be the same, or differ from each other.

Exemplary embodiment 3 can be combined with the exemplary embodiment 1 or 2. In the modifications 1 to 4 of the exemplary embodiment 2, a no-light-emission transmission pattern may be formed into an organic EL panel.

Also in the exemplary embodiment 3, an organic EL panel which reflects light does not have to reflect light from over the whole surface of a panel face. Further, a portion which does not reflect light may be composed so that it may make light penetrate through it. In this case, a pattern that reflects light may be formed into organic EL panels of no smaller than 2. For example, in FIG. 10, it is conceivable to form a pattern that reflects light into the organic EL panels 18 and 19. Meanwhile, a no-light-emission transmission pattern does not need to overlap with a pattern that reflects light. By combinations of these, various kinds of decorative or designing effects can be caused. When a pattern that reflects light is formed into organic EL panels of no smaller than 2, according to a position to see the organic EL luminescent device 1, a way how a light-emission pattern looks changes complicatedly.

(Exemplary Embodiment 4)

Figure 12:
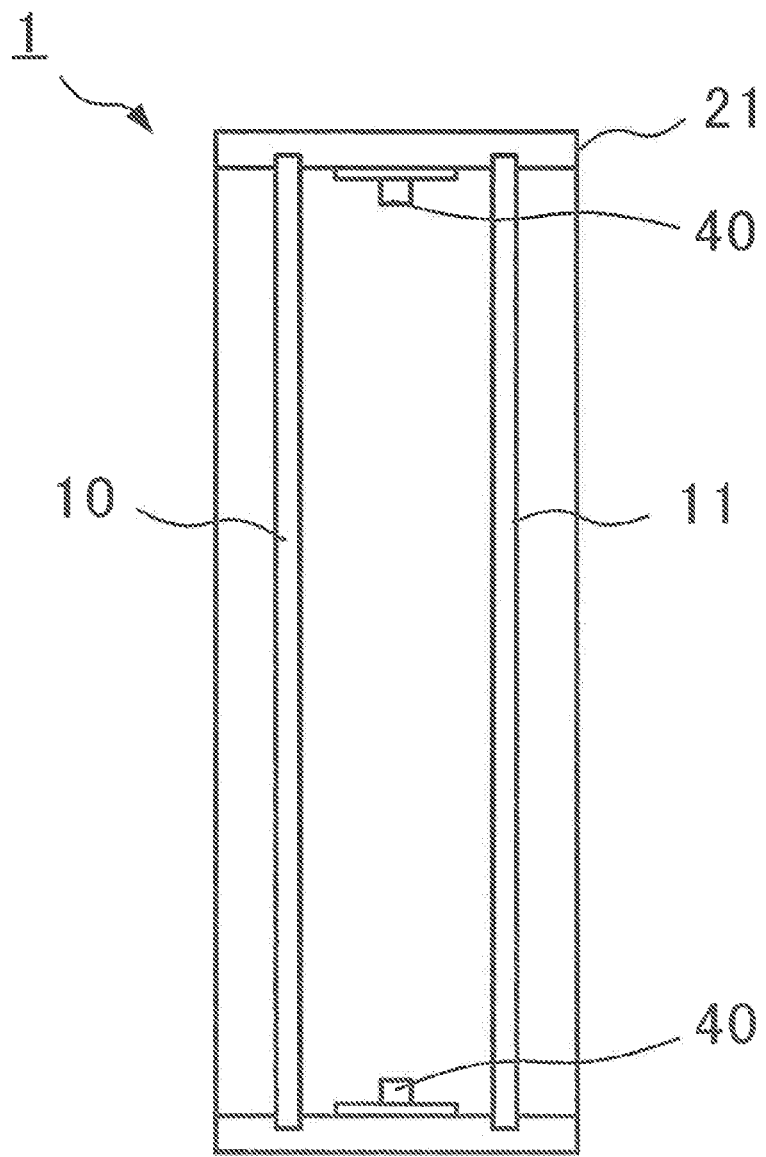
FIG. 12 is a sectional view of an organic EL luminescent device according to exemplary embodiment 4 of the present invention.

FIG. 12 is a sectional view of an organic EL luminescent device according to the exemplary embodiment 4 of the present invention. An organic EL luminescent device 1 of the exemplary embodiment 4 has a light source 40 that emits light toward the gap between the neighboring organic EL panels 10 and 11. For example, an LED (Light Emitting Diode) is arranged in the internal surface side of the support 21 in the gap between the organic EL panels 10 and 11. The light source 40 applies light in a direction of the panel surfaces of the organic EL panels 10 and 11 of the both sides of the gap.

By providing the light source 40 in the gap between the organic EL panels 10 and 11, and applying light toward the gap, a different kind of patterns (gradation) of emitted light can be formed. In addition, the emission intensity of the organic EL luminescent device 1 can be made stronger. There is a case where the luminescent color of the light source 40 is the same as the luminescent color of the organic EL panels 10 and 11, and a case they are different from each other.

FIG. 12 is of a structure in which the light source 40 is provided in the organic EL luminescent device 1 of the exemplary embodiment 1. The exemplary embodiment 4 can be combined with the exemplary embodiment 2 or 3. Whenever there is a gap to arrange the light source 40, the light source 40 can be arranged between any organic EL panels. That is, when at least two organic EL panels are arranged with a gap between them having just a space to enable arrangement of the light source 40, the light source 40 can be arranged in the gap.

The light source 40 arranged in a gap between organic EL panels is not limited to an LED. For example, a halogen lamp or a fluorescent lamp may be arranged. A light guiding member may be arranged in a gap between organic EL panels to guide light of the light source 40 and, at the same time, to spread it.

Part or all of the above-mentioned exemplary embodiments can also be described like the following supplementary notes, but not limited to the followings.

(Supplementary note 1) An organic EL luminescent device, comprising:

organic EL panels of no smaller than 2 including a light-transmitting organic EL panel, said light-transmitting organic EL panel having a first electrode, formed on a transparent substrate, having optical transparency, an organic layer, formed on said first electrode, having a light emitting layer, and a second electrode, formed on said organic layer, having optical transparency; and a support to support said no-smaller-than-2 organic EL panels in a manner arranging said light-transmitting organic EL panel in one end in a direction crossing a main surface of said organic EL panel, and overlapping said no-smaller-than-2 organic EL panels with each other.

(Supplementary note 2) The organic EL luminescent device according to supplementary note 1, wherein at least one organic EL panel among said no-smaller-than-2 organic EL panels includes a reflecting member to reflect light.

(Supplementary note 3) The organic EL luminescent device according to supplementary note 2, wherein said organic EL panel including said reflecting member is located in an end in said overlapping direction.

(Supplementary note 4) The organic EL luminescent device according to any one of supplementary notes 1-3, including a reflection plate in an end in a direction of overlapping said no-smaller-than-2 organic EL panels, said reflection plate reflecting light by a face facing toward said organic EL panel, wherein all of said organic EL panels include at least a portion to make light penetrate through.

(Supplementary note 5) The organic EL luminescent device according to any one of supplementary notes 1-4, wherein said support supports all of said organic EL panels in a manner making a directions of main surfaces be in parallel with each other.

(Supplementary note 6) The organic EL luminescent device according to any one of supplementary notes 1-4, wherein said support supports at least one of said organic EL panels in a direction making a main surface of said at least one organic EL panel crossing a main surface of any other one of said organic EL panels.

(Supplementary note 7) The organic EL luminescent device according to any one of supplementary notes 1-6, wherein, in a part of a panel surface of at least one of said organic EL panels, a no-light-emission transmission pattern to make light penetrate through without emitting light is formed.

(Supplementary note 8) The organic EL luminescent device according to any one of supplementary notes 1-7, wherein each of said organic EL panels has a monochromatic luminescent color.

(Supplementary note 9) The organic EL luminescent device according to any one of supplementary notes 1-8, wherein each of said organic EL panels has a luminescent color different from each other.

(Supplementary note 10) The organic EL luminescent device according to any one of supplementary notes 1-9, arranging at least two of said organic EL panels neighboring each other in a manner having a predetermined gap between said two panels, and comprising a light emitting means to apply light toward said gap between said organic EL panels in a direction of a panel surface of said organic EL panels of both sides of said gap.

Various exemplary embodiments of the present invention and their transformations are possible without departing from the wide gist and range of the invention. Each of the above-mentioned exemplary embodiments is for describing the present invention, and it is not intended to limit the scope of the present invention. The scope of the present invention is indicated by the attached claims rather than the exemplary embodiments. Various transformations accomplished within the scope of the claims of the present invention and within the scope equivalent to the claims of the invention are included in the scope of present invention.

The present invention is based on Japanese Patent Application Number 2013-3196, filed on Jan. 11, 2013. It is supposed that the description, the claims and the whole drawings of Japanese Patent Application Number 2013-3196 are incorporated herein in their entirety by reference.

INDUSTRIAL APPLICABILITY

The present invention can be used for an organic EL panel luminescent device using an organic EL panel, for example.

REFERENCE SIGNS LIST

1 Organic EL luminescent device
10, 11, 12 and 13 Organic EL panel
14, 15 and 16 Organic EL panel
17, 18 and 19 Organic EL panel
17a, 18a and 19a Light-emission pattern
17b, 18b No-light-emission transmission pattern
19b No-light-emission pattern
21, 22, 23 and 24 Support
30 Reflection plate
31 Substrate
32 Anode
33 Organic layer
34 Barrier-property conductive layer
35 Cathode
36 Reflection electrode
40 Light source

The invention claimed is:

1. An organic EL luminescent device, comprising:
organic EL panels of no smaller than 2 including a light-transmitting organic EL panel, said light-transmitting organic EL panel having a first electrode, formed on a transparent substrate, having optical transparency, an organic layer, formed on said first electrode, having a light emitting layer, and a second electrode, formed on said organic layer, having optical transparency;
a support to support said no-smaller-than-2 organic EL panels in a manner overlapping each other; and
a reflection plate in an end in a direction of overlapping said no-smaller-than-2 organic EL panels, said reflection plate reflecting light by a face facing toward said organic EL panel, wherein
all of said organic EL panels include at least a portion to make light penetrate through.

2. The organic EL luminescent device according to claim 1, wherein
at least one organic EL panel among said no-smaller-than-2 organic EL panels includes a reflecting member to reflect light.

3. The organic EL luminescent device according to claim 2, wherein
said organic EL panel including said reflecting member is located in an end in said overlapping direction.

4. The organic EL luminescent device according to claim 1, wherein
said support supports all of said organic EL panels in a manner making a directions of main surfaces be in parallel with each other.

5. The organic EL luminescent device according to claim 1, wherein
said support supports at least one of said organic EL panels in a direction making a main surface of said at least one organic EL panel crossing a main surface of any other one of said organic EL panels.

6. The organic EL luminescent device according to claim 1, wherein,
in a part of a panel surface of at least one of said organic EL panels, a no-light-emission transmission pattern to make light penetrate through without emitting light is formed.

7. The organic EL luminescent device according to claim 1, wherein
each of said organic EL panels has a monochromatic luminescent color.

8. The organic EL luminescent device according to claim 1, wherein
each of said organic EL panels has a luminescent color different from each other.

9. The organic EL luminescent device according to claim 1,
arranging at least two of said organic EL panels neighboring each other in a manner having a predetermined gap between said two panels, and
comprising a light emitting means to apply light toward said gap between said organic EL panels in a direction of a panel surface of said organic EL panels of both sides of said gap.

10. The organic EL luminescent device according to claim 1,
arranging at least two of said organic EL panels neighboring each other in a manner having a predetermined gap between said two panels, and
comprising a light emitting unit that applies light toward said gap between said organic EL panels in a direction of a panel surface of said organic EL panels of both sides of said gap.

11. An organic EL luminescent device, comprising:
organic EL panels of no smaller than 2 including a light-transmitting organic EL panel, said light-transmitting organic EL panel having a first electrode, formed on a transparent substrate, having optical transparency, an organic layer, formed on said first electrode, having a light emitting layer, and a second electrode, formed on said organic layer, having optical transparency; and
a support to support said no-smaller-than-2 organic EL panels in a manner overlapping each other, wherein
said support supports at least one of said organic EL panels in a direction making a main surface of said at least one organic EL panel crossing a main surface of any other one of said organic EL panels.

12. An organic EL luminescent device, comprising:
organic EL panels of no smaller than 2 including a light-transmitting organic EL panel, said light-transmitting organic EL panel having a first electrode, formed on a transparent substrate, having optical transparency, an organic layer, formed on said first electrode, having a light emitting layer, and a second electrode, formed on said organic layer, having optical transparency; and
a support to support said no-smaller-than-2 organic EL panels in a manner overlapping each other, wherein
in a part of a panel surface of at least one of said organic EL panels, a no-light-emission transmission pattern to make light penetrate through without emitting light is formed.

* * * * *